(12) United States Patent
Zhu et al.

(10) Patent No.: US 7,217,994 B2
(45) Date of Patent: May 15, 2007

(54) STACK PACKAGE FOR HIGH DENSITY INTEGRATED CIRCUITS

(75) Inventors: Sherry Xiaoqi Zhu, San Diego, CA (US); Cam T. Nguyen, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 140 days.

(21) Appl. No.: 11/002,480

(22) Filed: Dec. 1, 2004

(65) Prior Publication Data

US 2006/0113653 A1 Jun. 1, 2006

(51) Int. Cl.
*H01L 23/02* (2006.01)

(52) U.S. Cl. .................. 257/686; 257/700; 257/723; 257/693; 257/E25.027

(58) Field of Classification Search ............... 257/686
See application file for complete search history.

(56) References Cited

U.S. PATENT DOCUMENTS

| 5,057,441 A | 10/1991 | Gutt et al. |
| 5,783,870 A | 7/1998 | Mostafazadeh et al. |
| 6,288,347 B1 | 9/2001 | Nakagawa et al. |
| 6,564,454 B1 | 5/2003 | Glenn et al. |
| 6,599,774 B2 * | 7/2003 | Hultmark et al. ........... 438/107 |
| 6,881,607 B2 | 4/2005 | Farnworth |
| 7,009,297 B1 | 3/2006 | Chiang et al. |
| 2001/0036748 A1 * | 11/2001 | Rutter et al. ................ 438/745 |
| 2002/0001670 A1 | 1/2002 | Pauw et al. |
| 2003/0156454 A1 * | 8/2003 | Wei et al. ............... 365/185.17 |
| 2004/0038450 A1 | 2/2004 | King et al. |
| 2004/0145054 A1 | 7/2004 | Bang et al. |
| 2004/0180471 A1 | 9/2004 | Matsuura et al. |
| 2005/0009259 A1 | 1/2005 | Farnworth |
| 2005/0104196 A1 * | 5/2005 | Kashiwazaki ............... 257/706 |
| 2006/0057773 A1 | 3/2006 | Gross |

* cited by examiner

*Primary Examiner*—Tu-Tu Ho

(57) ABSTRACT

A stack package for a high density memory module includes at least one memory chip, an ASIC and an interposer, wherein the interposer comprises a first surface having contacts arranged in electrical communication with corresponding contacts on the ASIC and a second, substantially opposite surface including contacts arranged in electrical communication with corresponding contacts on a PCB. The at least one memory chip is dimensioned to fit within a cutout section in the interposer.

18 Claims, 2 Drawing Sheets

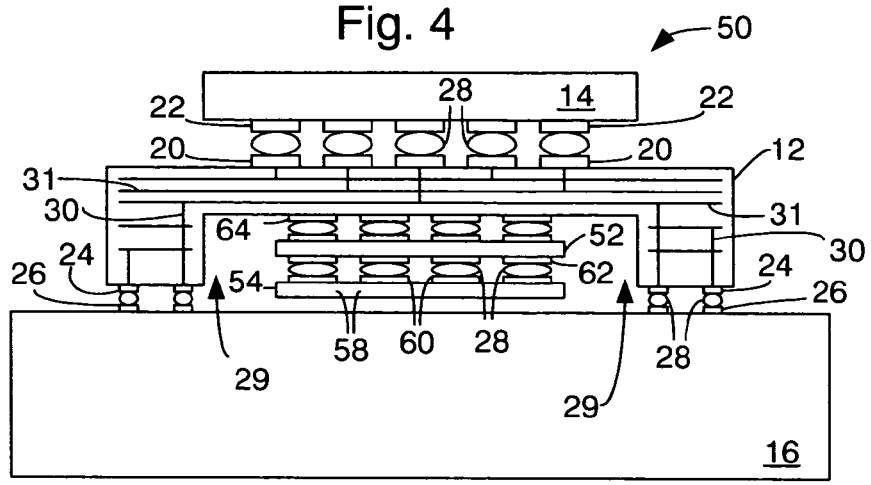
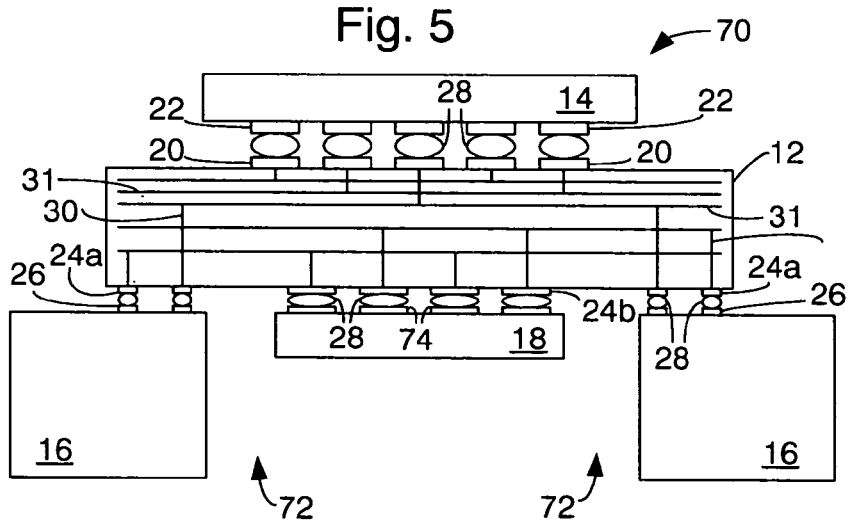
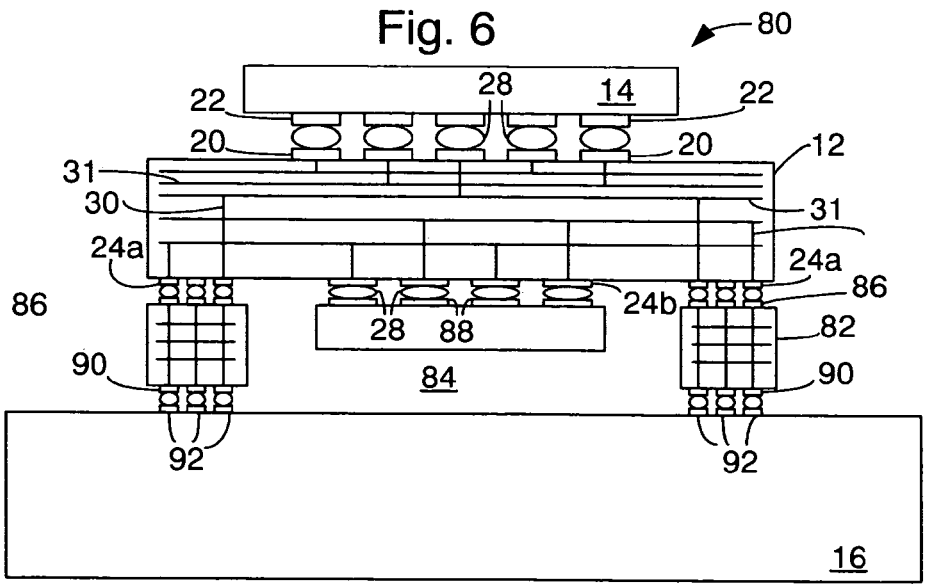

STACK PACKAGE FOR HIGH DENSITY INTEGRATED CIRCUITS

FIELD OF THE INVENTION

The present invention relates generally to integrated circuit (IC) packaging and electrical connections.

BACKGROUND OF THE INVENTION

Electronic package designs for today's high speed electronic systems (e.g., computers, cell phones, network devices, etc.) must provide quality electrical performance and reliable electronic connections between various system components such as cards, chips, boards, modules, etc. Additionally, these electronic connections are often manufactured to be as dense as possible such that they use the least possible amount of space on the printed circuit board (PCB).

Most modern software applications require enormous amounts of volatile random access memory (RAM) at increasingly high speeds. The maximum operating speed of a memory system is determined in large part by the electrical connections between the memory devices and the memory controller. The total amount of memory available on a system is determined by the capacity of the memory devices, the number of electrical connections on the memory devices and the amount of space available to support additional memory devices.

SUMMARY OF THE INVENTION

The present invention provides stack packages for high density application specific integrated circuits (ASIC's) and memory modules that effectively reduce PCB size. A PCB usually contains a plurality of layers, the densest of which is the interconnection between the application specific integrated circuits (ASIC) and the memory chips. An objective of the present invention is to remove such high density PCB layers and instead use interposers to stack these components. Stacking provides a much more efficient use of PCB space. A stack package according to the principles of the present invention includes a routing interposer disposed between the IC, commonly an ASIC, and another chip, such as a memory chip. The interposer functions as a translator between the ASIC and memory and may replace hundreds of lines between the ASIC and the memory. Advantageously, the interposer can be used with known chips (e.g., ASIC) such that one does not have to design a new chip with unknown results. The interposer could be either an individual piece or a substrate carrier for memory or an ASIC.

These and other features and advantages of the present invention will be appreciated from review of the following detailed description of the invention, along with the accompanying figures in which like reference numerals refer to like parts throughout.

BRIEF DESCRIPTION OF THE DRAWINGS

FIG. 4. is a side sectional view of a third alternative embodiment of a stack package for a high density memory module;

FIG. 5. is a side sectional view of a fourth alternative embodiment of a stack package for a high density memory module; and FIG. 6. is a side sectional view of a fifth alternative embodiment of a stack package for a high density memory module.

DETAILED DESCRIPTION

Figure 1:
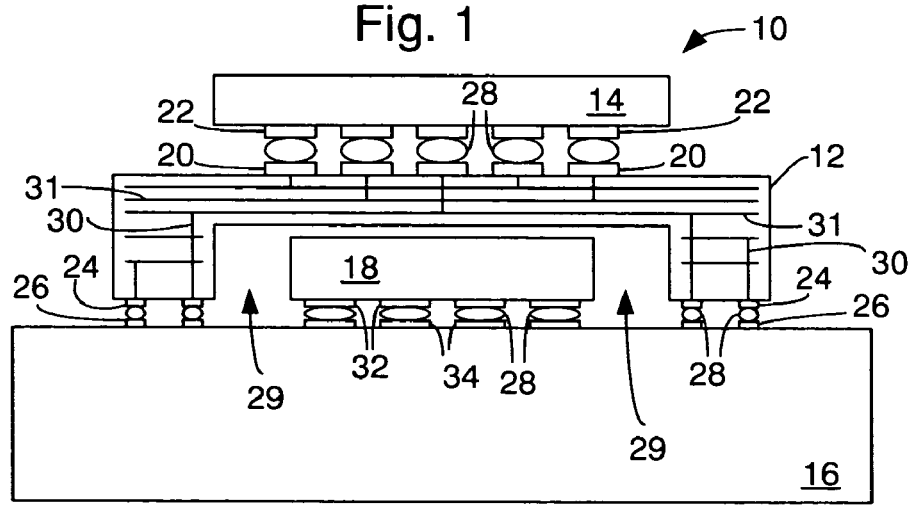
FIG. 1. is a side sectional view of a stack package for a high density memory module in accordance with the principles of the present invention.

Referring to FIG. 1, a stack package 10 for a high density IC module will now be described. Stack package 10 comprises an interposer 12, an IC 14 and a chip carrier 18 in electrical communication with a PCB 16. IC 14 may be an ASIC, such as a wireless communication signal base band processor. Chip carrier 18 may be a memory chip carrier 18. For purposes of illustration, IC 14 is discussed herein as an ASIC and chip carrier 18 is discussed as a memory chip carrier 18. The packaging and connecting methods and systems described herein can be used with other types of IC's and chips, such as, for example, general microprocessors and peripheral integrated circuits associated with ASIC's and microprocessors, such as digital signal processor, wireless communication transmit and receive chips. Additionally, many types of memory are possible, as will be described more fully below.

As seen in FIG. 1, memory chip carrier 18 is directly mounted on the PCB 16 and interposer 12 is disposed generally between the ASIC 14 and the PCB 16. Interposer 12 is preferably made from a sheet of dielectric material that does not experience significant thermal expansion or contraction and with a high glass transition temperature. The interposer is disposed between a pair of system components, wherein each system component includes a plurality of contact points, arranged in a linear or two-dimensional array. The interposer thereby provides the electrical connection between the contact points. Additional circuit elements may be stacked and electrically connected using additional interposers to create three-dimensional packages.

Interposer 12 includes a first surface including contact pads 20 that are arranged in a pattern complementary to that of contact pads 22 on the ASIC 14. On the opposite surface, interposer 12 has contact pads 24 arranged in a pattern complementary to that of contact pads 26 on the PCB 16. Solder balls are used to provide electrical and mechanical connections between interposer 12 and PCB 16. Interposer 12 further comprises metallic vias 30 that route electrical signals between contact pads 20, 24. Contact pads 20, 24 are arranged in different patterns such that vias 30 must route electrical signals between the PCB 16 and ASIC 14.

As shown in FIG. 1, interposer 12 further includes a space saving and height reduction cutout section 29. Memory chip carrier 18 is dimensioned to fit within cutout section 29 between the interposer and PCB, thereby providing a significant height reduction and space savings. Memory chip carrier 18 carries one or more memory chips including, but not limited to, random access memory (RAM), static random access memory (SRAM), dynamic random access memory (DRAM), Flash memory and other memory chips. Memory chip carrier 18 includes contact pads 32 that are in electrical communication with contact pads 34 on PCB 16 using solder balls 28.

Advantageously, interposer 12 allows a reduction in the PCB layer count, thereby providing a significant space and cost savings. Another advantage of using interposer 12 is that the lines between components (e.g., between the ASIC and memory) are shortened. Shorter lines account for faster times for functions between components and overall enhanced performance. Additionally, shorter lines provide a reduction in spurious electromagnetic radiation.

Further advantages of the interposer include: an increase in design flexibility since a change in a chip does not require a new layout of the entire main PCB, just the interposer; a reduction in product size; a lower processing cost; can utilize surface mount technology (SMT) with a few upgrades; expands the traditional two dimensional SMT process into a three dimensional process; much easier to create stack package than stack chips by wire bonding; can combine flip chip and SMT process; the stacking process can be completed in a single step reflow cycle; can be extended to different chips.

When stacking the individual substrates of stack package 10 onto PCB 16, each substrate is preferably dipped into a tacky flux before being placed onto the PCB or stacked onto another substrate. This process is repeated for all the substrates of the stack package. Then, the stacked package is sent through a reflow oven, thereby melting the solder paste and forming the solder joints. It may require only one pass through the reflow oven for the entire stacked package. Some critical stacking process parameters include: the rigidity and flatness of the interposer board and chip carrier board; the solder ball height and uniformity; the flux type and tackiness; the flux dipping height; the flux dwell time, dipping time and throughput; placement force and speed during stacking; reflow and double side reflow. Prevention of warping of the interposer is critical. Accordingly, the interposer should be made of high Tg dielectric materials. Additionally, the thickness should be designed to reach the rigidity requirement. The process parameters are optimized through several designs of experiments. It is found that a few milliseconds of dwell time during dipping and placement improved the yield, and the dipping height should be around 50%–75% of solder ball height. Pad size should be designed and calculated to prevent the drop off of the package during second side reflow.

Figure 2:
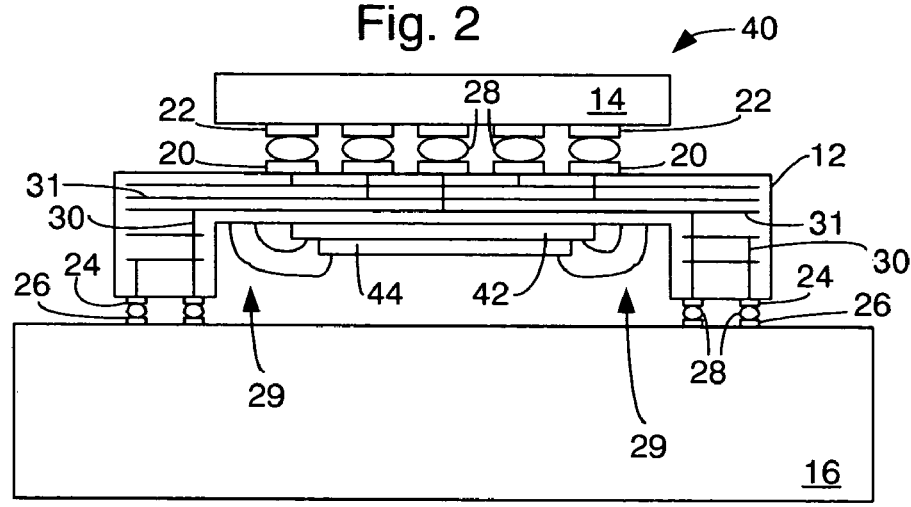
FIG. 2. is a side sectional view of a first alternative embodiment of a stack package for a high density memory module.

Referring to FIGS. 2–6, some alternative stack packages for high density memory modules according to the principles of the present invention will now be described. In FIGS. 2–7, elements similar to those of FIG. 1 have been numbered accordingly. As shown in FIG. 2, stack package 40 includes an interposer 12, an ASIC 14, a first memory chip 42 and a second memory chip 44. Similar to the previous embodiment, interposer 12 is disposed generally between the ASIC 14 and the PCB 16. Interposer 12 includes a first surface including contact pads 20 that are arranged in a pattern complementary to that of contact pads 22 on the ASIC 14 and a second, opposite surface including contact pads 24 arranged in a pattern complementary to that of contact pads 26 on the PCB 16. Vias 30 route electrical signals among the PCB 16 and ASIC 14 and memory chips 42, 44.

Interposer 12 further includes a space saving cutout and height reduction section 29 disposed on the first surface between contact pads 20. Memory chips 42, 44 are preferably disposed within cutout section 29 between the interposer 12 and PCB 16. Memory chips 42, 44 are wire bonded to the interposer 12 within cutout section 29 such that they are in electrical communication with the PCB 16 and ASIC 14, and then the whole cutout section is molded with epoxy. According to some embodiments, memory chip 42 is a Flash memory chip and memory chip 44 is an SRAM chip. Of course, as would be understood by those of ordinary skill in the art, memory chips 42, 44 may comprise numerous other types of chips without departing from the scope of the present invention.

Figure 3:
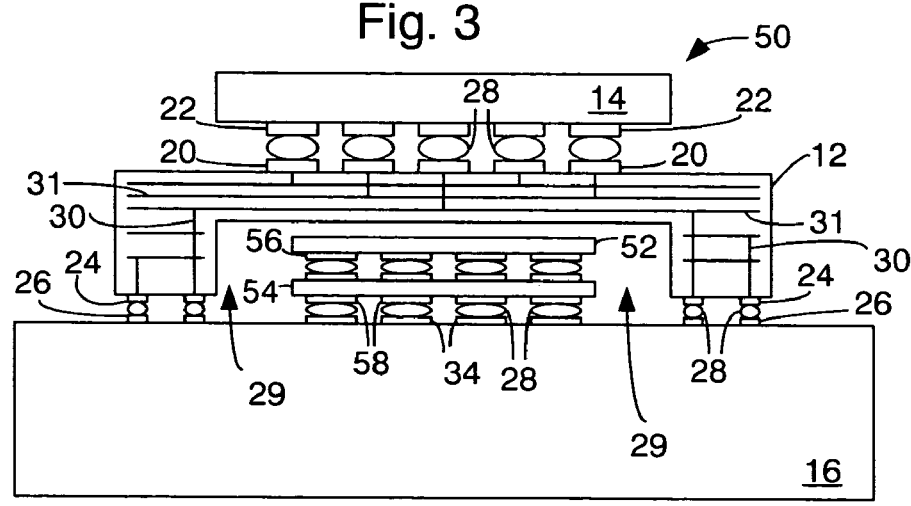
FIG. 3. is a side sectional view of a second alternative embodiment of a stack package for a high density memory module.

Referring to FIGS. 3 and 4, stack package 50, 60 each include an interposer 12, an ASIC 14, a first memory chip 52 and a second memory chip 54. Similar to previous embodiments, interposer 12 is disposed generally between the ASIC 14 and the PCB 16. Interposer 12 includes a first surface including contact pads 20 that are arranged in a pattern complementary to that of contact pads 22 on the ASIC 14 and a second, opposite surface including contact pads 24 arranged in a pattern complementary to that of contact pads 26 on the PCB 16. Vias 30 route electrical signals among the PCB 16 and ASIC 14 and memory chips 52, 54.

Memory chips 52, 54 are disposed within space saving cutout section 29 between the interposer 12 and PCB 16. In the stack package 50 of FIG. 3, memory chip 54 is mounted directly to PCB 16 and memory chip 52 is stacked on top of memory chip 54. More particularly, memory chip 52 includes contact pads 56 arranged in a pattern complementary to that of contact pads 58 on memory chip 54, which are arranged in a pattern complementary to that of contact pads 26 on the PCB 16. By contrast, in the stack package 60 of FIG. 4, memory chip 52 is mounted directly to interposer 12 and memory chip 54 is stacked on the bottom of memory chip 52. In this embodiment, memory chip 54 includes contact pads 60 arranged in a pattern complementary to that of contact pads 62 on memory chip 52, which are arranged in a pattern complementary to that of contact pads 64 on the interposer 12. Alternatively, only one chip, such as memory chip 52 is disposed within space saving cutout section 29. For example, memory chip 54, need not be present. In still another alternative, memory chips 52 and 54 could be disposed adjacent to each other, rather than stacked one over the other.

Referring to FIG. 5, stack package 70 includes an interposer 12, an ASIC 14 and a memory chip carrier 18. Similar to the previous embodiments, interposer 12 is disposed generally between the ASIC 14 and the PCB 16. However, unlike previous embodiments, interposer 12 does not include a space saving cutout section 29. Instead, PCB 16 includes a central cutout section 72, wherein memory chip carrier is dimensioned to fit within the cutout section 72, thereby providing a significant space savings. Memory chip carrier 18, which carries one or more memory chips including, but not limited to, RAM, SRAM, DRAM, Flash memory and other memory chips, is mounted directly to the interposer 12.

Interposer 12 includes a first surface including contact pads 20 that are arranged in a pattern complementary to that of contact pads 22 on the ASIC 14. Additionally, interposer 12 includes a second, opposite surface including: contact pads 24a arranged in a pattern complementary to that of contact pads 26 on the PCB 16; and (2) contact pads 24b arranged in a pattern complementary to that of contact pads 74 on memory carrier 18. Vias 30 route electrical signals among the PCB 16 and ASIC 14 and memory chip carrier 18.

Referring to FIG. 6, stack package 80 includes a first interposer 12, an ASIC 14, a memory chip carrier 18 and a second interposer 82 having a central cutout section 84. First interposer 12 is disposed generally between the ASIC 14 and the second interposer 82, which is disposed generally between the first interposer 12 and the PCB 16. Memory chip carrier 18 carries one or more memory chips, such as including, RAM, SRAM, DRAM, Flash memory and other memory chips Interposer 12 includes a first surface including contact pads 20 that are arranged in a pattern complementary to that of contact pads 22 on the ASIC 14. Additionally, interposer 12 includes a second, opposite surface including: (1) contact pads 24a arranged in a pattern complementary to that of contact pads 86 on interposer 82; and (2) contact pads 24b arranged in a pattern complementary to that of contact pads 88 on the memory chip carrier 18. Vias 30 route electrical signals among the PCB 16 and ASIC 14 and memory chip carrier 18.

As shown in FIG. 6, memory chip carrier 18 is dimensioned to fit within cutout section 84, thus providing the desired space savings and height reduction. Interposer 82 includes a first surface including contact pads 86 arranged in a pattern complementary to that of contact pads 24a on interposer 12 and a second surface including contact pads 90 arranged in a pattern complementary to that of contact pads 92 on PCB 16.

Thus, it is seen that a stacked package for an ASIC and a memory chip is provided. One skilled in the art will appreciate that the present invention can be practiced by other than the various embodiments and preferred embodiments, which are presented in this description for purposes of illustration and not of limitation, and the present invention is limited only by the claims that follow. It is noted that equivalents for the particular embodiments discussed in this description may practice the invention as well.

What is claimed is:

1. A stack package for a high density memory usage means, comprising:
   integrated circuit (IC) comprising a processing means;
   an interposer comprising:
      a first surface having contacts arranged in electrical communication with corresponding contacts on the processing means;
      a second surface substantially opposite the first surface, the second surface including contacts arranged in electrical communication with corresponding contacts on a PCB;
      a cavity formed on the second surface forming a third surface opposite the first surface and closer to the first surface; and
      a first plurality of layer connecting means that route a first plurality of electrical signals between the processing means and the PCB; and
   at least one memory storage means dimensioned to fit within the cavity of the interposer and electrically connected to contact pads on the third surface.

2. The stack package of claim 1, wherein the interposer further comprises a second plurality of layer connecting means that route a second plurality of electrical signals between the at least one memory storage means and the PCB.

3. The stack package of claim 1, wherein the interposer further comprises a third plurality of layer connecting means that route a third plurality of electrical signals between the at least one memory storage means and the processing means.

4. The stack package of claim 1, wherein the at least one memory storage means includes a plurality of stacked memory storage means.

5. The stack package of claim 1, wherein the at least one memory storage means is carried by a memory storage means carrier.

6. The stack package of claim 5, wherein the memory storage means carrier includes contacts arranged in electrical communication with the contacts pads on the third surface.

7. The stack package of claim 6, wherein the interposer further comprises a fourth plurality of layer connecting means that route electrical signals between the processing means, the PCB and the at least one memory storage means.

8. The stack package of claim 1, wherein the at least one memory storage means includes a Flash ram chip and an SRAM chip.

9. A stack package for a printed circuit board, comprising:
   an integrated circuit;
   an interposer comprising:
      a first surface electrically connected to the integrated circuit;
      a second surface electrically connectable to the printed circuit board;
      a recessed area formed within the second surface forming a third surface; and
      a plurality of conductive vias for providing a plurality of electrical connections between the integrated circuit, the printed circuit board, and at least one memory chip; and
   the at least one memory chip positioned within the recessed area of the interposer and electrically connected to contact pads on the third surface.

10. The stack package of claim 9, wherein the at least one memory chip includes a plurality of stacked memory chips.

11. The stack package of claim 9, wherein the at least one memory chip is carried by a memory chip carrier.

12. The stack package of claim 11, wherein the memory chip carrier includes contacts arranged in electrical communication with the contact pads on the third surface.

13. The stack package of claim 9, wherein the at least one memory chip includes a Flash ram chip and an SRAM chip.

14. The stack package of claim 9, wherein the third surface is closer to the first surface than the second surface and is parallel to the first surface.

15. An interposer for mounting to a printed circuit board, the interposer comprising:
   a dielectric material having a first surface, a second surface opposite the first surface, and a recess within the second surface to form a third surface closer to the first surface than the second surface;
   a first plurality of contact pads arranged on the first surface in a pattern complimentary to a contact pattern of an integrated circuit;
   a second plurality of contact pads on the second surface configured to contact printed circuit board contacts;
   a third plurality of contact pads arranged in a pattern complimentary to contact pads on a memory chip; and
   a plurality of metallic vias within the dielectric material and electrically connecting at least one of the third plurality of contact pads to at least one of the second plurality of contact pads.

16. The interposer of claim 15, wherein the plurality of metallic vias comprise:
   a metallic via electrically connecting one of the first plurality of contact pads to one of the second plurality of contact pads; and
   another metallic via electrically connecting another one of the first plurality of contact pads to another one of the third plurality of contact pads.

17. The interposer of claim 15, wherein the third surface is parallel to the first surface.

18. The interposer of claim 17, wherein the second surface is parallel to the first surface.

* * * * *